United States Patent [19]

Morong, III

[11] 4,286,225
[45] Aug. 25, 1981

[54] ISOLATION AMPLIFIER

[75] Inventor: William H. Morong, III, Perry, Me.

[73] Assignee: Analog Devices, Incorporated, Norwood, Mass.

[21] Appl. No.: 108,540

[22] Filed: Dec. 31, 1979

[51] Int. Cl.³ .............................................. H03F 3/38
[52] U.S. Cl. ...................................................... 330/10
[58] Field of Search ........................................... 330/10

[56] References Cited

U.S. PATENT DOCUMENTS

| 3,988,690 | 10/1976 | Vance et al. | 330/10 |
| 4,066,974 | 1/1978 | Reinhard | 330/10 |
| 4,152,660 | 5/1979 | Olschewski | 330/10 |

Primary Examiner—James B. Mullins
Assistant Examiner—Gene Wan
Attorney, Agent, or Firm—Parmelee, Johnson, Bollinger & Bramblett

[57] ABSTRACT

An isolation amplifier comprising an input section coupled by a multi-winding transformer to an output section. A blocking oscillator produces in the transformer a signal comprising a positive power pulse followed by a negative flyback pulse. The flyback pulse magnitude is modulated by a half-wave diode-capacitor rectifier circuit which supplies negative supply current to an amplifier in the input section. Other half-wave diode-capacitor rectifier circuits in the input section develop (1) a positive supply voltage for the amplifier, (2) a negative feedback signal for the amplifier, and (3) a level-shifting voltage to be combined with the feedback signal. The output section includes additional half-wave diode-capacitor rectifier circuits to develop a demodulation signal derived from the flyback pulse, and a bias voltage to be combined with that signal to develop an input signal for the output amplifier.

28 Claims, 1 Drawing Figure

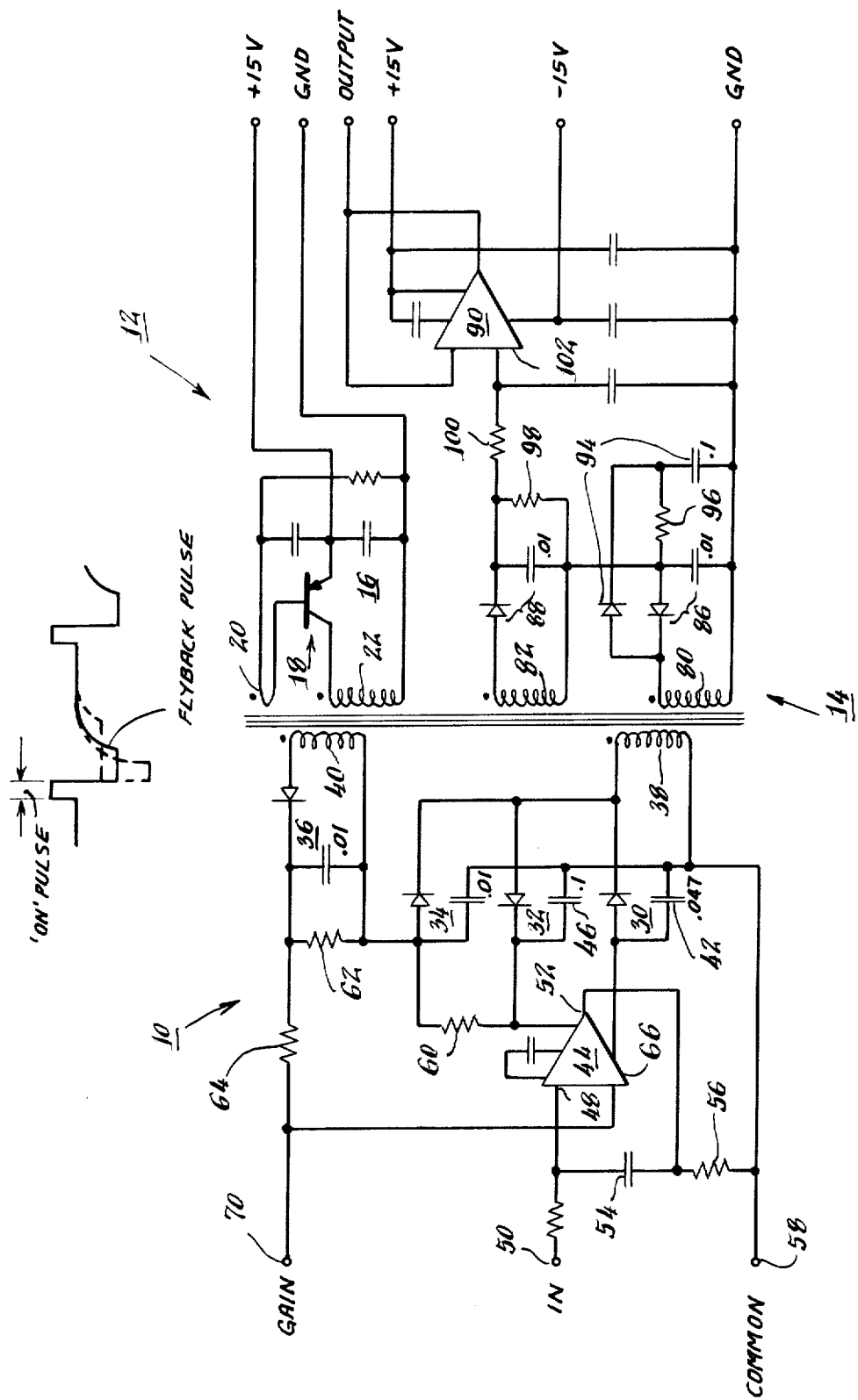

ISOLATION AMPLIFIER

BACKGROUND OF THE INVENTION

1. Field of the Invention

This invention relates to isolation amplifiers, i.e. amplifiers having an input section which is galvanically isolated from all other portions of the equipment. More particularly, this invention relates to such isolators wherein the input and output sections are coupled by a single transformer serving the dual functions of supplying energizing power to the input section and carrying signal information to the output section.

2. Description of the Prior Art

A wide variety of isolators have been employed in the past for applications such as developing measurement signals for industrial process control systems, making medical measurements of the human body, and so on. A number of such isolators have employed a single transformer for effecting non-conductive coupling between the input section and other portions of the isolator. For example, U.S. Pat. No. 3,988,690 shows a design wherein such a single transformer includes three separate windings. In that arrangement, the power drawn through the transformer by the input section varies in accordance with the applied input signal and this power variation is detected in the output to produce a corresponding output signal.

U.S. Pat. No. 4,066,974 is directed to an arrangement which uses a transformer limited to only two windings, i.e. a single primary winding and a single secondary winding. The secondary winding is connected alternately to a d-c voltage and to a high-impedance. The d-c voltage connection couples energizing power through the transformer to develop a d-c power supply voltage in the input section, and the following high impedance connection produces a reverse-polarity flyback pulse which is modulated by the signal applied to the input section. The magnitude of the flyback pulse is detected in the output section to produce a corresponding output signal. A subsequent development, described in U.S. Pat. No. 4,152,660, adds to U.S. Pat. No. 4,066,974 the concept of utilizing the d-c power pulse in the transformer to produce a steady d-c voltage in the output section for energizing amplifier circuitry in that output section.

Experience with devices such as described in the above patents has shown that all suffer from important disadvantages, particularly with respect to performance characteristics such as drift of output signal with changes in temperature, non-linearity of the relationship between input and output, and changes in gain with temperature.

SUMMARY OF THE INVENTION

It is a principal object of the present invention to provide an improved transformer-coupled signal isolator of the type utilizing alternating power and flyback pulses. Still another object of this invention is to provide such an isolator which is relatively inexpensive to manufacture, yet reliable in operation.

In accordance with an important aspect of the invention, significantly improved performance is achieved by means of unique circuit arrangements effecting inherent matching of the variations of selected corresponding d-c signals in the isolator circuitry. An isolator of the type described herein makes use of an arrangement wherein voltages of relatively large magnitude are connected in subtractive opposition to develop a resulting difference voltage. In such an arrangement, small non-equal variations in the opposed voltages can produce relatively large percentage changes in the net difference voltage, and this in turn can cause excessive errors in the output of the isolator, e.g. due to changes in ambient temperature. It has been found, however, that such variations can be substantially reduced by employing simplified matched circuit configurations which assure that selected pairs of d-c signals in the isolator closely track one another, thereby to minimize differential effects, and particularly to reduce variations in isolator performance with changes in temperature. Other objects, aspects and advantages of the invention will in part be pointed out in, and in part apparent from, the following detailed description considered together with the accompanying drawing.

BRIEF DESCRIPTION OF THE DRAWING

FIG. 1 is a schematic diagram of a preferred embodiment of the present invention.

DESCRIPTION OF THE PREFERRED EMBODIMENT

Referring now to FIG. 1, the presently preferred isolator in accordance with the invention comprises input and output sections 10 and 12 coupled by a transformer 14 having one single-turn winding and five identical 8-turn windings. The output section 12 includes a free-running inductively-coupled blocking oscillator generally indicated at 16. This oscillator comprises a transistor 18 with its base connected to the single-turn winding 20 and its collector connected to one of the 8-turn windings 22.

As indicated in the waveform shown directly above the transformer 14 in FIG. 1, the blocking oscillator cycle includes a positive "on" pulse, produced by the power supply voltage, followed by a negative "flyback" pulse which is unclamped in the oscillator. As will be explained, the magnitude of the flyback pulse is modulated in accordance with the input signal applied to the input section 10 of the isolator.

The oscillator on-time is a function of the transformer saturation characteristics, i.e. the time to saturation, whereas the off-time is a function of an RC time-constant. In one preferred arrangement, the oscillator frequency was approximately 200 KHz, with a 0.5 microsecond "on" time and a 4.5 microsecond "off" time. Suitable saturation characteristics were obtained in a core made of Ferroxcube 3C8 ferrite.

In the input section 10 of the isolator, there are four half-wave rectifier circuits 30, 32, 34, 36 coupled to the transformer 14. Each of these rectifier circuits consists of a diode in series with a filter capacitor. Three of these rectifier circuits 30, 32, 34 are connected across a single transformer winding 38, but as will be explained the fourth rectifier circuit 36 is connected across a separate transformer winding 40. Two of the rectifier circuits 30, 34 are poled to respond to the negative "flyback" pulse developed in the transformer by the blocking oscillator 16. The other two rectifier circuits 32, 36 are oppositely poled, to respond to the positive "on" power pulse of the oscillator output waveform. All of the rectifier circuits develop across their respective filter capacitors d-c voltages corresponding to the magnitude of whichever pulse (flyback, or power) they are poled to respond to.

The negative d-c voltage developed across the filter capacitor 42 of the first half-wave rectifier circuit 30 is applied to the negative supply terminal of an operational amplifier 44, e.g. an IC chip of the type conventionally identified as a 308, and manufactured by a number of companies. The positive supply terminal of this amplifier receives the positive d-c voltage (about 15 volts) developed across the filter capacitor 46 of the second rectifier circuit 32. The amplifier input 48 is connected through a resistor (100 K ohms) to the input terminal 50 of the isolator, to receive the applied input signal. The amplifier output terminal 52 is connected through a capacitor 54 back to the amplifier input 48 to effect system frequency compensation. The output terminal 52 also is connected to input common 58 by a small resistor 56 (470 ohms) to accommodate the desired a-c feedback through capacitor 54 while completing the d-c negative supply current return path through the amplifier output substantially at common potential.

As the input signal applied to the amplifier changes, there will be a corresponding change in the d-c supply current drawn from the negative rectifier voltage-supply circuit 30. The supply current drawn from that rectifier circuit loads down the flyback stroke of the oscillator 16, such that changes in the supply current correspondingly modulate the magnitude of the flyback pulse (as indicated in dotted lines in the waveform shown in FIG. 1). Thus the rectifier circuit 30 functions as a modulator, under control of the applied input signal. This arrangement wherein the negative supply current is used to vary the load on the modulator 30 eliminates the need for a separate and additional modulator transistor driven by the amplifier output signal.

The third half-wave rectifier circuit 34 is loaded by a resistor 60 (220 K ohms) returned to the positive supply terminal for the amplifier 44, and produces a negative d-c voltage proportional to the magnitude of the modulated flyback pulse in the transformer 14. That is, the rectifier circuit 34 demodulates the flyback pulse magnitude as controlled by the modulator circuit 30. The negative d-c voltage produced by the third rectifier circuit 34 is used as a negative feedback signal for the amplifier 44, to effect correspondence between the amplifier input signal and the modulation signal developed by the first rectifier circuit 30.

To assure that this feedback signal is at the correct voltage level for the input circuit of the amplifier 44, the negative d-c signal from the third rectifier circuit 34 is connected in series with a positive d-c level-shifting voltage (about 15 volts) produced by the fourth half-wave rectifier circuit 36. This rectifier circuit is loaded by a resistor 62 (100 K ohms) connected directly across the filter capacitor. The combined voltage signal developed by the two rectifier circuits 34, 36 is connected through a feedback resistor 64 (240 K ) to the input 66 of the amplifier. With this feedback arrangement, the negative supply current of the amplifier drawn from the modulator rectifier circuit 30 is automatically controlled so as to clamp the flyback pulse to the correct magnitude such that the sum of the voltages produced by the two upper rectifier circuits 34 and 36 equals the isolator input voltage.

The isolator as described above has unity gain in the input section 10. However, the isolator is arranged so that the input section can develop a gain greater than unity. This is controlled by connecting an external resistor (not shown) between the gain terminal 70 and the input common line 58. With that connection, the amplifier gain will be proportional to the ratio of resistances of the feedback resistor 64 and the external resistor.

It should particularly be noted that in the arrangement described above, the modulator circuit 30 and the demodulator circuit 34 are coupled to the same transformer winding 38. It has been found that this use of the same winding for both of these circuits provides economy in construction of the isolator without any adverse effect on performance.

It also should be noted that the d-c level-shifting voltage circuit 36 is energized by a transformer winding 40 which is entirely separate from the modulate/demodulate winding 38. This arrangement is especially advantageous because the level-shifting voltage can thereby be developed independently of the feedback signal from the corresponding rectifier circuit 34. Such independent signal development can, as in the present embodiment, be carried out by the identical type of circuit used in producing the feedback signal, e.g. the basically simple series-connected half-wave rectifier/filter circuit composed of a diode and a capacitor. This in turn minimizes the number of components which must track with changes in temperature.

By thus reducing the component tracking variables to only the bare essential elements, and by using identical circuits for developing the two voltages which are to be subtractively combined, the effects of temperature-induced drift are significantly reduced, thereby providing more accurate performance. In addition, the use of such simplified, low-part-count circuitry simultaneously reduces the cost of manufacturing the isolator.

Referring now to the output section 12 of the isolator, the transformer 14 includes two further 8-turn windings 80 and 82 which are identical to the two windings 38 and 40 for the input section 10. One of these further windings 80 drives a diode-capacitor half-wave rectifier circuit 86 which is the exact counterpart of the diode-capacitor demodulator circuit 34 in the input section, and which also produces a negative d-c voltage proportional to the magnitude of the flyback pulse as controlled by the diode-capacitor modulator circuit 30.

This negative demodulation voltage from the rectifier circuit 86 is connected in series with a fixed-value positive d-c bias voltage (e.g. about 15 volts) from another diode-capacitor rectifier circuit 88 (corresponding directly to rectifier circuit 36) and coupled to the remaining winding 82. The subtractive combination of these signals develops a d-c input signal of appropriate level for an amplifier 90 (e.g. type 308) which produces the isolator output signal.

The lower transformer winding 80 also energizes a supplemental diode-capacitor circuit 94 which produces a fixed-level d-c voltage corresponding to the voltage produced by the input section rectifier circuit 32. This fixed-level voltage in the output section serves as the reference voltage for the load resistor 96 (220 K) of the output demodulation rectifier circuit 86, thereby assuring that this demodulation circuit performs in a fashion identical to that of the feedback demodulator circuit 34, so that the two demodulator signals will track one another very closely.

A load resistor 98 (100 K) is coupled across the filter capacitor of the bias voltage rectifier circuit 88 to effect identical correspondence with the level-shifting rectifier circuit 36 in the input section 10. The combined demodulation and bias voltage signal is directed through an input resistor 100 (100 K) to an input terminal 102 of the amplifier 90. The external circuitry for this amplifier also includes appropriate filter and compensation capacitors as shown.

Although a specific preferred embodiment of the invention has been disclosed herein in detail, it is to be understood that this is for the purpose of illustrating the invention, and should not be construed as necessarily limiting the scope of the invention, since it is apparent that many changes can be made to the disclosed structure by those skilled in the art to suit particular applications.

I claim:

1. An electrical signal isolator comprising:
   input and output sections;
   a transformer coupling said input and output sections;
   a first amplifier forming part of said input section to receive an input signal;
   a second amplifier forming part of said output section to develop an output signal;
   means for generating in said transformer an alternating pulse signal comprising a power pulse followed by a flyback pulse;
   first winding means for said transformer;
   a first diode/capacitor half-wave rectifier circuit forming part of said input section and coupled to said first winding means;
   said first rectifier circuit being poled to respond to said flyback pulse;
   means coupling said first amplifier to said first half-wave rectifier circuit to effect modulation of the magnitude of said flyback pulse in accordance with said input signal;
   a second diode/capacitor half-wave rectifier circuit forming part of said input section and coupled to said first winding means;
   said second rectifier circuit being poled to respond to said power pulse to produce a d-c power voltage for said first amplifier;
   a third diode/capacitor half-wave rectifier circuit forming part of said input section and coupled to said first winding means;
   said third rectifier circuit being poled to respond to said flyback pulse to develop a d-c negative feedback signal for said first amplifier;
   second winding means for said transformer separate from said first winding means;
   a fourth diode/capacitor half-wave rectifier circuit forming part of said input section and coupled to said second winding means;
   said fourth rectifier circuit being poled to respond to said power pulse to produce a d-c level shifting voltage;
   means connecting said level-shifting voltage in series with said feedback signal to provide a feedback voltage level within the operating range of said first amplifier;
   third winding means for said transformer separate from said first and second winding means; and
   diode/capacitor rectifier means coupled to said third winding means to develop an input signal for said second amplifier.

2. Apparatus as claimed in claim 1, wherein said first winding means comprises at least one multi-turn winding;
   said first and third half-wave rectifier circuits both being coupled to said multi-turn winding.

3. Apparatus as claimed in claim 2, wherein said second half-wave rectifier circuit also is coupled to said multi-turn winding.

4. Apparatus as claimed in claim 1, wherein said diode/capacitor rectifier means in said output section comprises fifth and sixth half-wave rectifier circuits;
   said fifth rectifier circuit being poled to respond to said flyback pulse to produce a d-c modulation signal;
   said sixth rectifier circuit being poled to respond to said power pulse to produce a d-c bias signal; and
   means connecting said d-c modulation signal in series with said bias signal to produce an input signal for said second amplifier.

5. Apparatus as claimed in claim 4, wherein said third winding means comprises a pair of separate multi-turn windings;
   said fifth and sixth rectifier circuits being coupled respectively to said pair of separate windings.

6. Apparatus as claimed in claim 5, including a load connected between the feedback signal developed by said third rectifier and a fixed reference voltage in said input section; and
   a second load connected between the d-c modulation signal developed by said fifth rectifier circuit and a fixed reference voltage in said output section.

7. Apparatus as claimed in claim 6, wherein each of said loads is a resistor.

8. Apparatus as claimed in claim 7, wherein said fixed reference voltage in the input section is said d-c power voltage developed by said second rectifier circuit;
   a seventh diode/capacitor rectifier in said output section and coupled to one of said pair of windings;
   said seventh rectifier circuit being identical to said second rectifier circuit to produce a corresponding d-c voltage to serve as said fixed reference voltage in said output section.

9. Apparatus as claimed in claim 1, wherein the output of said first amplifier is connected to circuit common for said input section;
   the negative voltage developed by said first diode/capacitor rectifier circuit being connected to the negative supply terminal of said first amplifier and responsive to the current drawn by said first amplifier so as to modulate the magnitude of said flyback pulse in accordance with the magnitude of the input signal applied to said first amplifier.

10. An electrical signal isolator comprising:
    input and output sections;
    a transformer coupling said input and output sections;
    a first amplifier forming part of said input section to receive an input signal;
    a second amplifier forming part of said output section to develop an output signal;
    means for generating in said transformer an alternating pulse signal comprising a power pulse followed by a flyback pulse;
    first winding means for said transformer comprising at least one multi-turn winding;
    a first diode/capacitor half-wave rectifier/filter circuit forming part of said input section and coupled to said multi-turn winding;
    said first rectifier/filter circuit being poled to respond to said flyback pulse;
    means coupling said first amplifier to said first half-wave rectifier/filter circuit to effect modulation of the magnitude of said flyback pulse in accordance with said input signal;
    a second diode/capacitor half-wave rectifier/filter circuit forming part of said input section and coupled to said winding means;

said second rectifier/filter circuit being poled to respond to said power pulse to produce a d-c power voltage for said first amplifier;
a third diode/capacitor half-wave rectifier/filter circuit forming part of said input section and coupled to said multi-turn winding;
said third rectifier/filter circuit being poled to respond to said flyback pulse to develop a d-c negative feedback signal for said first amplifier;
a fourth diode/capacitor half-wave rectifier/filter circuit forming part of said input section and coupled to said first winding means;
said fourth rectifier/filter circuit being poled to respond to said power pulse to produce a d-c level-shifting voltage;
means connecting said level-shifting voltages in series with said feedback signal to provide a feedback voltage level within the operating range of said first amplifier;
second winding means for said transformer separate from said first winding means; and
diode/capacitor rectifier means coupled to said second winding means to develop an input signal for said second amplifier.

11. Apparatus as claimed in claim 10, wherein said first and third rectifier/filter circuits each consists of a series-connected diode-and-capacitor connected together across said multi-turn winding.

12. Apparatus as claimed in claim 10, wherein said first winding means includes a second multi-turn winding;
said fourth rectifier/filter circuit being coupled to said second multi-turn winding.

13. Apparatus as claimed in claim 12, wherein said second winding means comprises third and fourth multi-turn windings;
said diode/capacitor rectifier means comprising fifth and sixth half-wave rectifier/filter circuits coupled respectively to said third and fourth multi-turn windings;
said fifth rectifier/filter circuit being poled to respond to said flyback pulse to develop a d-c modulation signal;
said sixth rectifier/filter circuit being poled to respond to said power pulse to produce a d-c bias signal;
means connecting said d-c modulation signal in series with said bias signal and to the input of said second amplifier.

14. Apparatus as claimed in claim 13, wherein said third and fourth rectifier/filter circuits are identical to, respectively, said fifth and sixth rectifier/filter circuits.

15. Apparatus as claimed in claim 14, wherein said first and second multi-turn windings are identical to, respectively, said third and fourth multi-turn windings.

16. In an electrical signal isolator of the type including input and output sections, a transformer coupling said input and output sections, a first amplifier forming part of said input section to receive an input signal, a second amplifier forming part of said output section to develop an output signal, means for generating in said transformer an alternating pulse signal comprising a power pulse followed by a flyback pulse, that improvement comprising:
a first multi-turn winding for said transformer;
a first series-connected diode-capacitor rectifier/filter circuit connected across said first winding and poled to respond to said flyback pulse;
means coupling said first amplifier to said first rectifier circuit to effect modulation of the magnitude of said flyback pulse in accordance with said input signal;
a second series-connected diode-capacitor rectifier/filter circuit connected across said first winding and poled to respond to said power pulse to produce a d-c power voltage for said first amplifier;
a third series-connected diode-capacitor rectifier/filter circuit connected across said first winding and poled to respond to said flyback pulse to develop a d-c negative feedback signal for said first amplifier;
a second multi-turn winding for said transformer separate from said first winding;
a fourth series-connected diode-capacitor rectifier/filter circuit connected across said second winding and poled to respond to said power pulse to produce a d-c level-shifting voltage;
means connecting said level-shifting voltage in series withsaid feedback signal to provide a feedback voltage having a level within the operating range of said first amplifier;
a third multi-turn winding for said transformer identical to said first winding;
a fifth series-connected diode-capacitor rectifier/filter circuit connected across said third winding and poled to respond to said flyback pulse to produce a d-c modulation signal;
a fourth multi-turn winding for said transformer identical to said second winding;
a sixth series-connected diode-capacitor rectifier/filter circuit connected across said fourth winding to produce a d-c bias signal; and
means connecting said d-c modulation signal in series with said bias signal to produce an input signal for said second amplifier.

17. Apparatus as claimed in claim 16, wherein said fifth rectifier/filter circuit is identical to said third rectifier/filter circuit, and said sixth rectifier/filter circuit is identical to said fourth rectifier/filter circuit.

18. Apparatus as claimed in claim 17, wherein all of said windings are identical.

19. Apparatus as claimed in claim 18, wherein all of said rectifier/filter circuits are in configuration.

20. Apparatus as claimed in claim 19, including a seventh rectifier/filter circuit identical to said fourth rectifier/filter circuit and connected across one of said third or fourth windings.

21. In an electrical signal isolator of the type including input and output sections, a transformer having first and second winding means coupling said input and output sections, a first amplifier forming part of said input section to receive an input signal, a second amplifier forming part of said output section to develop an output signal, means for generating in said transformer winding means an alternating pulse signal comprising a power pulse followed by a flyback pulse;
that improvement in such an isolator comprising:
first diode-capacitor rectifier means coupled to said first winding means and poled to respond to said flyback pulse to produce a corresponding d-c voltage;
means connecting said corresponding d-c voltage to a supply terminal of said first amplifier to provide for modulation of the magnitude of said flyback pulse in accordance with the amount of supply current drawn by said first amplifier;

second diode-capacitor rectifier means coupled to said first winding means to develop a d-c negative feedback signal for said first amplifier; and third diode-capacitor rectifier means coupled to said second winding means to produce an input signal for said second amplifier corresponding to the modulated magnitude of said flyback pulse.

22. Apparatus as claimed in claim 21, wherein the output of said first amplifier is connected to the common lead of said input section, to hold the amplifier output level at a substantially constant d-c value.

23. Apparatus as claimed in claim 22, including a resistor connecting said amplifier output to common; and a capacitor coupling said amplifier output to the amplifier input to effect system compensation.

24. In an electrical signal isolator of the type including input and output sections, a transformer coupling said input and output sections, a first amplifier forming part of said input section to receive an input signal, a second amplifier forming part of said output section to develop an output signal; that improvement in such isolator comprising:

a transistor having a base, collector, and emitter;

first winding means for said transformer coupled between said base and said emitter;

second winding means for said transformer including at least one multi-turn winding coupled between said emitter and said collector;

d-c power supply means coupled to said emitter and said one multi-turn winding to energize said transistor and said windings to provide a free-running inductance-coupled blocking oscillator producing a power pulse followed by flyback pulse;

third winding means for said transformer;

first diode-capacitor rectifier means coupled to said third winding means and poled to respond to said flyback pulse;

means connecting said first amplifier to said first rectifier means to effect modulation of the magnitude of said flyback pulse in accordance with the input signal applied to said first amplifier;

second diode-capacitor rectifier means coupled to said third winding means to develop a d-c negative feedback signal for said first amplifier;

third diode-capacitor rectifier means coupled to said third winding means and poled to respond to said power pulse to produce a d-c power supply voltage for said first amplifier; and fourth diode-capacitor rectifier means coupled to said second winding means to produce an input signal for said second amplifier corresponding to the modulated magnitude of said flyback pulse.

25. Apparatus as claimed in claim 24, wherein said first winding means is a single-turn winding.

26. Apparatus as claimed in claim 24, including a first capacitor connected between said first winding means and said emitter; and a second capacitor connected between said emitter and said one multi-turn winding.

27. In an electrical signal isolator of the type including input and output sections, a transformer having first and second winding means coupling said input and output sections, a first amplifier forming part of said input section to receive an input signal, a second amplifier forming part of said output section to develop an output signal, means for generating in said transformer winding means an alternating pulse signal comprising a power pulse followed by a flyback pulse; a diode-capacitor circuit coupled to one of said winding means for modulating the magnitude of said flyback pulse in accordance with the input signal applied to said first amplifier; the improved method of modulating said flyback pulse comprising the steps of:

developing a d-c voltage on the capacitor of said diode-capacitor circuit responsive to said flyback pulse; and altering the magnitude of said flyback pulse by drawing from said d-c voltage a supply current for said amplifier which varies in accordance with said applied input signal.

28. The method of claim 27, including the step of holding the output of said first amplifier at least substantially constant while said supply current is varied in accordance with said input signal.

* * * * *